(12) United States Patent
Kim et al.

(10) Patent No.: US 6,893,744 B2
(45) Date of Patent: May 17, 2005

(54) ORGANIC ELECTROLUMINESCENT DISPLAY DEVICE

(75) Inventors: Myung Seop Kim, Kyounggido (KR); Hyoung Yun Oh, Seoul (KR)

(73) Assignee: LG Electronics Inc., Seoul (KR)

( * ) Notice: Subject to any disclaimer, the term of this patent is extended or adjusted under 35 U.S.C. 154(b) by 18 days.

(21) Appl. No.: 10/300,866

(22) Filed: Nov. 21, 2002

(65) Prior Publication Data

US 2003/0143428 A1 Jul. 31, 2003

(30) Foreign Application Priority Data

Dec. 20, 2001 (KR) ..................................... P2001-81833

(51) Int. Cl.⁷ .............................................. H05B 33/12
(52) U.S. Cl. ..................... 428/690; 428/332; 428/917; 313/504; 313/506
(58) Field of Search ............................... 428/690, 917, 428/332; 313/504, 506

(56) References Cited

U.S. PATENT DOCUMENTS

| 5,989,737 A | * | 11/1999 | Xie et al. .................... 428/690 |
| 6,172,459 B1 | * | 1/2001 | Hung et al. .................. 313/506 |
| 6,541,128 B2 | * | 4/2003 | Wehrmann et al. ......... 428/690 |

FOREIGN PATENT DOCUMENTS

JP  11-297474 A  *  10/1999

* cited by examiner

*Primary Examiner*—Dawn L. Garrett
(74) *Attorney, Agent, or Firm*—Fleshner & Kim, LLP

(57) ABSTRACT

Disclosed is an organic electroluminescent display device. The present invention includes a transparent substrate, an anode formed on the transparent substrate, an organic layer stacked on the anode, a cathode formed on the organic layer, and a buffer layer formed between the cathode and organic layer, the buffer layer including a first material selected from the group consisting of an alkaline metal and an alkaline earth metal compound and a second material selected from the group consisting of an organic compound and an organic metal compound.

16 Claims, 2 Drawing Sheets

ORGANIC ELECTROLUMINESCENT DISPLAY DEVICE

This application claims the benefit of the Korean Application No. P2001-81833 filed on Dec. 20, 2001, which is hereby incorporated by reference.

BACKGROUND OF THE INVENTION

1. Field of the Invention

The present invention relates to an electroluminescent display, and more particularly, to an organic electroluminescent display device having a buffer layer between a cathode and an organic layer.

2. Discussion of the Related Art

Lately, demands for flat display panels occupying less space increase as a display tends to increase in size. Rapidly developed is a technology of an organic electroluminescent (hereinafter abbreviated EL) device called an organic light-emitting diode (OELD) as one of such flat display panel devices.

An organic EL display is a device emitting light in a following manner. First of all, electric charges are injected into an organic layer formed between a hole injection electrode (anode) and an electron injection electrode (cathode). Electrons are then coupled with holes to form pairs, respectively, and then disappear so as to emit light.

It is advantageous that such a device can be driven by a predetermined voltage (ex. 5~10V) lower than that of a plasma display panel (PDP) or an inorganic EL display. Hence, many efforts are made to research and develop the organic EL device.

The organic EL device has excellent characteristics of wide viewing angle, high-speed response, high contrast, and the like, thereby being applicable to a pixel of a graphic display, a pixel of a TV video display, or a pixel of a surface light source. The device can be formed on a flexible transparent substrate such as a plastic substrate. The device can be fabricated extremely thin and light as well as provide excellent color tones. Hence, the organic EL device is suitable for the next generation flat panel display (FPD).

Moreover, the organic EL device enables to realize three colors of green, blue, and red, requires no backlight of a well-known liquid crystal display (LCD) so as to consume less power, and has the excellent color sense so as to become a matter of concern to realize the next generation full color display device.

FIG. 1 illustrates a cross-sectional view of a general organic EL display device. A process of fabricating a conventional organic EL display device is explained in order as follows.

First of all, an anode material is coated on a transparent substrate. In this case, ITO (indium tin oxide) is mainly used as the anode material.

A hole injection layer (HIL) is formed on the anode material. CuPc (copper phthalocyanine) is mainly used as a material of the hole injection layer and formed about 10~30 nm thick.

Subsequently, a hole transport layer (HTL) is formed. TPD{N,N'-diphenyl-N,N'-bis(3-methylphenyl)-(1,1'-biphenyl)-4,4'-diamine} or NPD{4,4'-bis[N-(1-naphthy)-N-phenyl-amino]biphenyl} is used as a material of the hole transport layer and formed about 30~60 nm thick.

An organic light-emitting layer is formed on the hole transport layer. In this case, a dopant can be added to the organic light-emitting layer. For instance, $Alq_3${tris(8-hydroxy-quinolate)aluminum} is used as a basic material of the organic light-emitting layer, and deposited about 30~60 nm thick. In this case, Coumarin 6 or Quinacridone (Qd) is widely used as a green dopant in general. Moreover, DCM, DCJT, DCJTB, or the like is mainly used as a red dopant for red luminescence.

And, an electron transport layer (ETL) and an electron injection layer (EIL) are successively deposited on the organic light-emitting layer.

Occasionally, in case of green luminescence, electron injection/transport layers are not formed additionally since $Alq_3$ used as the material of the organic light-emitting layer has the excellent electron transport capacity.

Subsequently, LiF or $Li_2O$ about 5 Å thick or alkaline metal or alkaline earth metal such as Li, Ca, Mg, Sm, or the like about 200 Å thick as an electron injection layer is coated thin thereon, thereby improving the electron injection.

Thereafter, Al is coated about 1,000 Å thick on the electron injection layer as a cathode. Unfortunately, the material of the electron injection layer such as LiF, $Li_2O$, or the like used for facilitating the electron injection into the organic light-emitting layer weakens the adhesion between the electron transport layer and cathode.

SUMMARY OF THE INVENTION

Accordingly, the present invention is directed to an organic electroluminescent display device that substantially obviates one or more problems due to limitations and disadvantages of the related art.

An object of the present invention is to provide an organic electroluminescent display device having a buffer layer between a cathode and an organic layer so as to improve the adhesion between a cathode and an organic layer as well as efficiency and durability of the device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic electroluminescent display device according to the present invention includes a transparent substrate, an anode formed on the transparent substrate, an organic layer stacked on the anode, a cathode formed on the organic layer, and a buffer layer formed between the cathode and organic layer, the buffer layer including a first material selected from the group consisting of an alkaline metal and an alkaline earth metal compound and a second material selected from the group consisting of an organic compound and an organic metal compound.

Preferably, the buffer layer is a mixture formed by co-depositing the first material selected from the group consisting of the alkaline metal and the alkaline earth metal compound and the second material selected from the group consisting of the organic compound and the organic metal compound.

Preferably, a composition ratio between the first and second materials x and y constituting the buffer layer is x:y=(1~100):1 or x:y=1:(1~100) and a total thickness of the buffer layer is 0.1~10 nm.

Preferably, the buffer layer is formed by stacking first/second layers or second/first layers in order and wherein the first layer is formed of one of alkaline metal and alkaline earth metal and the second layer is formed of one of organic compound and organic metal compound.

Preferably, each of the first and second layers is 0.1~20 nm thick and, a total thickness of the buffer layer including the first and second layers is as 0.1~40 nm.

Preferably, the buffer layer is formed to have a concentration gradient in accordance with positions of the first material of one of the alkaline metal and alkaline earth metal and the second material of one of the organic compound and organic metal compound.

Preferably, a composition ratio between the first and second materials x and y at an interface of the buffer layer contacted with the cathode is x:y=1:0 or x:y=0:1, wherein the composition ratio of the first and second materials x and y from the interface of the buffer layer contacted with the cathode to the other interface contacted with the organic layer has the concentration gradient, and wherein a total thickness of the buffer layer is 0.1~100 nm.

Preferably, the alkaline metal or alkaline earth metal compound is selected from the group consisting of Li, Na, K, Be, Mg, Ca, Sr, Ba, Y, La, Sm, Gd, Yb, Cs, $Li_2O$, $Li_2O_2$, $Rb_2O$, $Cs_2O$, $Rb_2O_2$, $Cs_2O_2$, $LiAlO_2$, $LiBO_2$, LiCl, RbCl, NaCl, $KAlO_2$, $NaWO_4$, $K_2SiO_3$, $Li_2CO$, BeO, MgO, CaO, SrO, BaO, RaO, Al:Li, Mg:Sr, and In:Li alloy.

Preferably, the organic compound or organic metal compound is an aromatic compound derivative.

Preferably, the organic layer comprises a hole injection layer, a hole transport layer, an organic light-emitting layer, and an electron transport layer.

More preferably, the buffer layer is formed between the cathode and electron transport layer.

More preferably, the buffer layer is formed between the cathode and organic light-emitting layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

The present invention is formed by stacking an anode, organic layers (hole injection layer, hole transport layer, organic light-emitting layer, electron transport layer, etc.), a buffer layer, and a cathode on a transparent substrate in order.

In this case, the buffer layer can be formed between the cathode and electron transport layer or between the cathode and organic light-emitting layer if there is no electron transport layer.

The buffer layer includes a first material selected from the group consisting of alkaline metal and alkaline earth metal compound and a second material selected from the group consisting of starburst type organic compound and organic metal compound.

Figure 1:
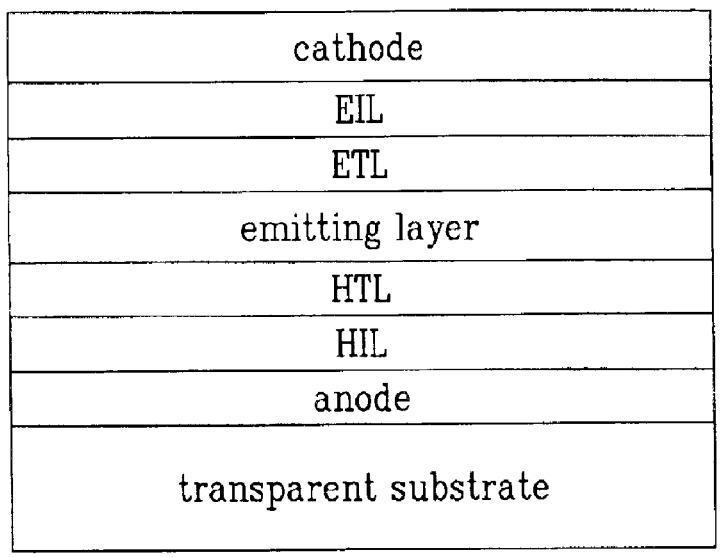
FIG. 1 illustrates a cross-sectional view of a general organic EL display device.
Figure 2:
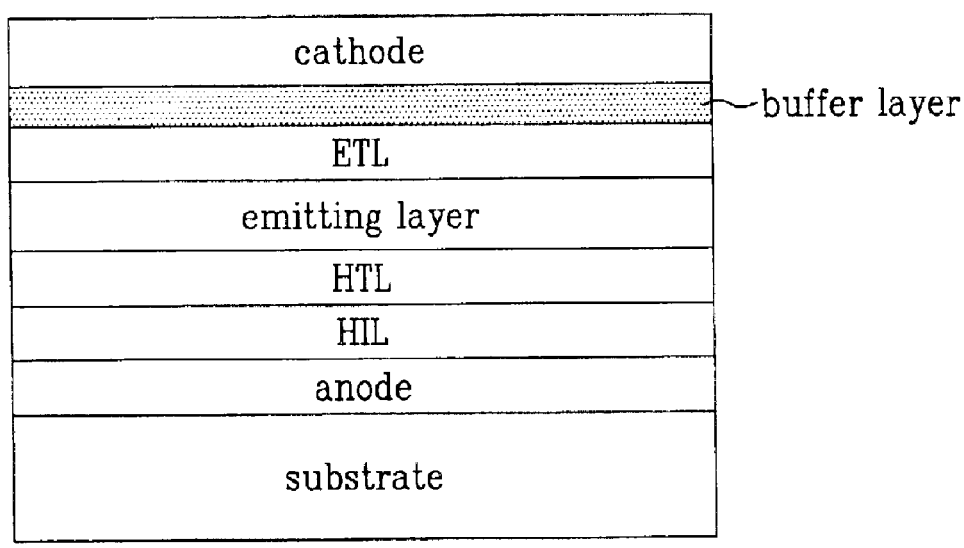
FIG. 2 illustrates a cross-sectional view of an organic EL display device having a buffer layer according to one first embodiment of the present invention.

The buffer layer, as shown in FIG. 2, can be formed by depositing simultaneously (co-depositing) the first material selected from the group consisting of the alkaline metal and alkaline earth metal compound and the second material selected from the group consisting of the starburst type organic compound and organic metal compound. In this case, a composition ratio between the first and second materials x and y constituting the buffer layer is x:y=(1~100):1 or x:y=1:(1~100) and a total thickness of the buffer layer is set up as 0.1~10 nm.

Figure 3:
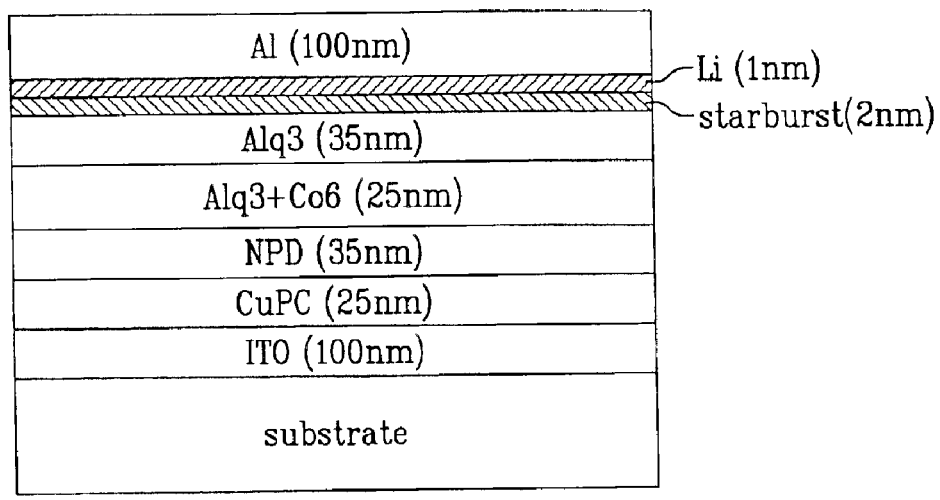
FIG. 3 illustrates a cross-sectional view of an organic EL display device having a buffer layer according to another first embodiment of the present invention.

And, the buffer layer, as shown in FIG. 3, can be formed by stacking first/second layers or second/first layers in order, in which the first layer is formed of one of alkaline metal and alkaline earth metal and the second layer is formed of one of organic compound and organic metal compound. In this case, the first and second layers are 0.1~20 nm thick, respectively. And, a total thickness of the buffer layer including the first and second layers is set up as 0.1~40 nm.

Moreover, the buffer layer can be formed to have a concentration gradient in accordance with positions of the first material of one of the alkaline metal and alkaline earth metal and the second material of one of the organic compound and organic metal compound. Namely, the composition ratio between the first and second materials x and y at an interface of the buffer layer contacted with the cathode is x:y=1:0 or x:y=0:1. And, the composition of the first and second materials x and y from the interface of the buffer layer contacted with the cathode to the other interface contacted with the organic layer has a concentration gradient. Besides, a total thickness of the buffer layer is set up as 0.1~100 nm.

In this case, the alkaline metal or alkaline earth metal compound can be selected from the group consisting of Li, Na, K, Be, Mg, Ca, Sr, Ba, Y, La, Sm, Gd, Yb, Cs, $Li_2O$, $Li_2O_2$, $Rb_2O$, $Cs_2O$, $Rb_2O_2$, $Cs_2O_2$, $LiAlO_2$, $LiBO_2$, LiCl, RbCl, NaCl, $KAlO_2$, $NaWO_4$, $K_2SiO_3$, $Li_2CO$, BeO, MgO, CaO, SrO, BaO, RaO, Al:Li, Mg:Sr, In:Li alloy, and the like, but is not limited theses elements.

The starburst type organic compound or organic metal compound can be an aromatic amine having the following structural formula 1 or an aromatic compound derivative as an aromatic compound having the following structural formula 2.

Aromatic amine is shown in the following structural formula 1.

Structural Formula 1

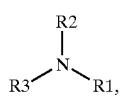

where In the above structural formula 1, each of R1, R2, and R3 is selected from the group consisting of hydrogen, alkyl group, substituted or unsubstituted aromatic ring, and substituted or unsubstituted aromatic amine. And, at least one of R1, R2, and R3 is substituted or unsubstituted aromatic ring or substituted or unsubstituted aromatic amine.

Specifically, the aromatic amine can be a compound having the following structural formula.

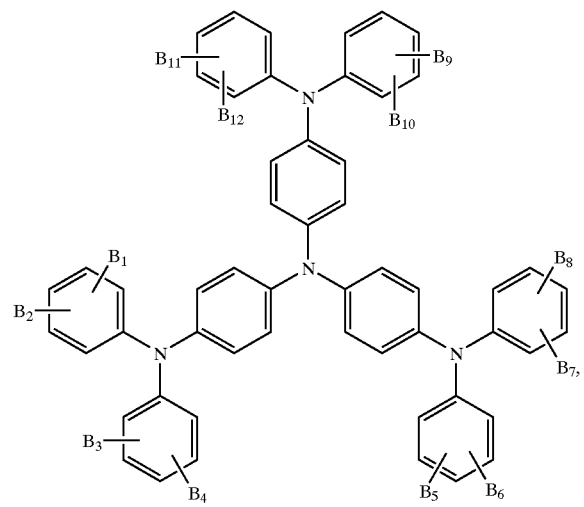

where each of $B_1$, $B_2$, $B_3$, $B_4$, $B_5$, $B_6$, $B_7$, $B_8$, $B_9$, $B_{10}$, $B_{11}$, and $B_{12}$ is selected from the group consisting of hydrogen, alkyl group, substituted or unsubstituted aromatic ring, and substituted or unsubstituted aromatic amine. And, they may be linked to each other so as to form a saturated or unsaturated fused cyclic ring.

More specifically, the aromatic amine can be selected from the group consisting of:

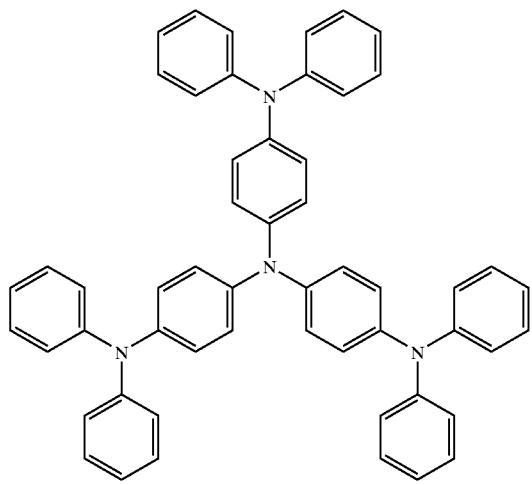

;

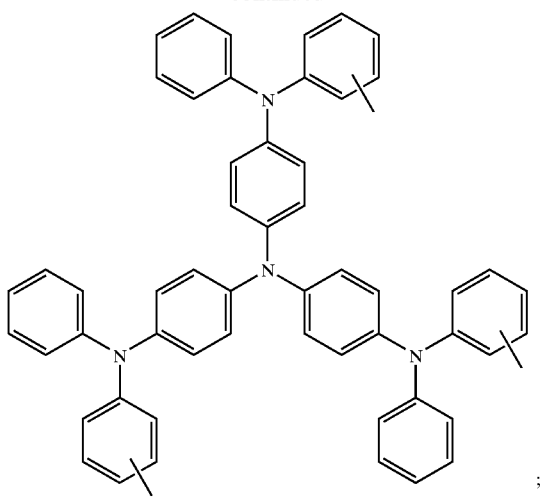

;

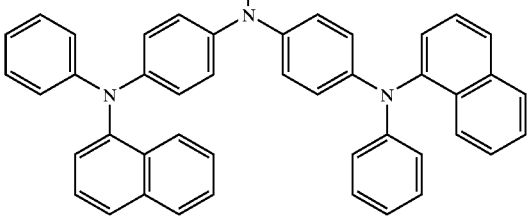

; and

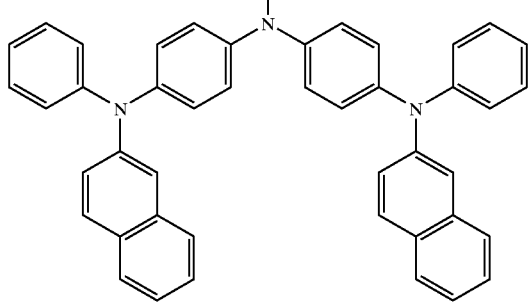

Specifically, the aromatic amine can have the following structural formula.

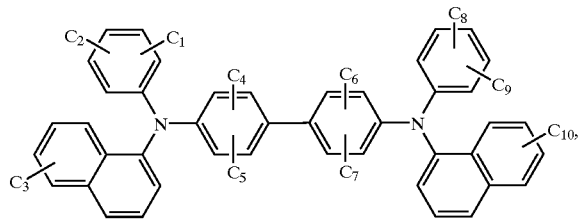

where each of $C_1$, $C_2$, $C_3$, $C_4$, $C_5$, $C_6$, $C_7$, $C_8$, $C_9$, and $C_{10}$ is selected from the group consisting of hydrogen, alkyl group, substituted or unsubstituted aromatic ring, and substituted or unsubstituted aromatic amine. And, they may be linked to each other so as to form a saturated or unsaturated fused cyclic ring.

More specifically, the aromatic amine can be selected from the group consisting of:

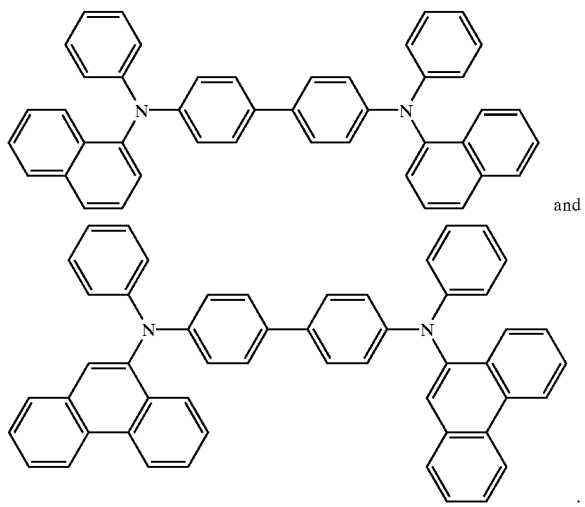

and

Meanwhile, the aromatic compound having the structural formula 2 is as follows:

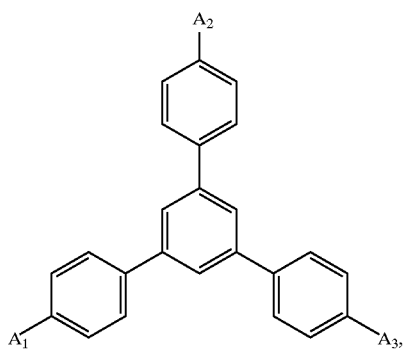

where each of $A_1$, $A_2$, and $A_3$ is selected from the group consisting of hydrogen, alkyl group, substituted or unsubstituted aromatic ring, and substituted or unsubstituted aromatic amine. And, one of $A_1$, $A_2$, and $A_3$ includes substituted or unsubstituted aromatic amine.

Specifically, the aromatic compound may be a compound having the following structural formula:

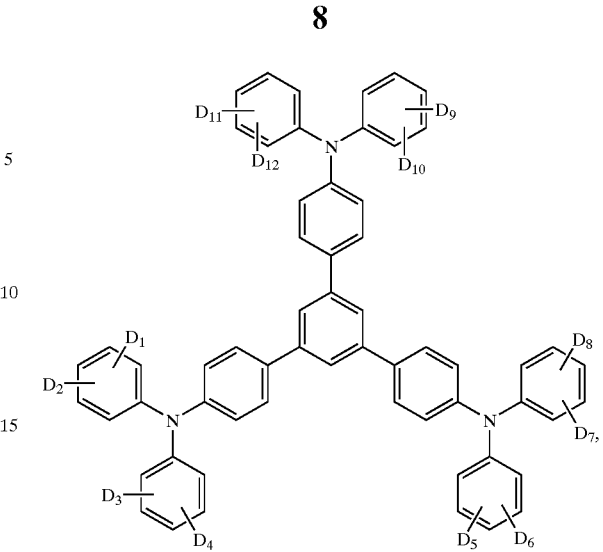

where each of $D_1$, $D_2$, $D_3$, $D_4$, $D_5$, $D_6$, $D_7$, $D_8$, $D_9$, $D_{10}$, $D_{11}$, and $D_{12}$ is selected from the group consisting of hydrogen, alkyl group, substituted or unsubstituted aromatic ring, and substituted or unsubstituted aromatic amine. And, they may be linked to each other so as to form a saturated or unsaturated fused cyclic ring.

The buffer layer preferably is 0.1~100 nm thick.

In the following embodiments of the present invention, an organic EL device including a buffer layer having the combination of the starburst type derivative and alkaline metal (or alkaline earth metal) is formed by reinforcing adhesion between the cathode and organic layer, whereby efficiency and durability of the device are improved. In such a buffer layer, the starburst type derivative plays a role in improving adhesion between the electron transport layer and electrode and Li plays a role in improving electron injection. Moreover, the buffer layer can be formed using various methods.

It will be apparent to those skilled in the art that various modifications and variations can be made in the embodiments of the present invention. Thus, it is intended that the following embodiments cover the modifications and variations of this invention provided they come within the scope of the appended claims and their equivalents.

First Embodiment

The first embodiment of the present invention is for fabricating the organic EL device shown in FIG. 2 using Li as alkaline metal.

A method of fabricating the device is explained as follows.

1) CuPc (copper phthalocyanine) having the following structural formula is coated about 25 nm thick on a transparent substrate of ITO so as to be used as a hole injection layer (HIL).

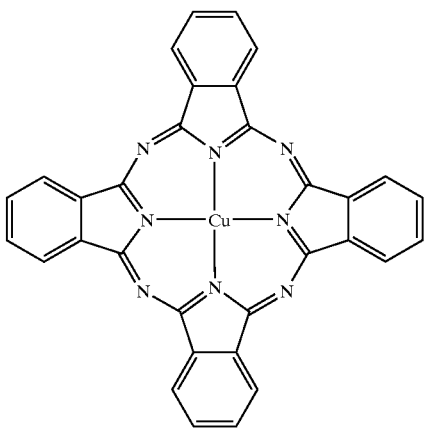

2) Subsequently, NPD having the following structural formula is coated about 35 nm thick thereon so as to be used as a hole transport layer.

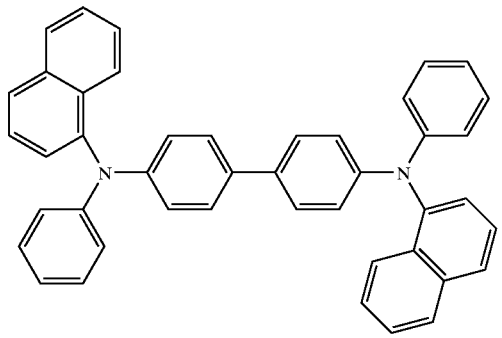

3) $Alq_3$ having the following structural formula is doped with Co6 by about 1%, and then coated on the hole transport layer so as to form a green light-emitting layer.

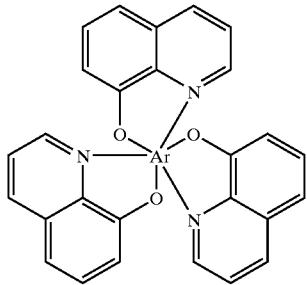

4) $Alq_3$ as an electron transport layer is coated about 35 nm thick thereon.

5) Starburst type derivative and Li are deposited on the electron transport layer in common so as to form a buffer layer. In this case, a ratio between the two materials is shown as follows.

Starburst type derivative:Li=x:y, where x=1~100 and y=1 or x=1 and y=1~100

Moreover, a total thickness thereof is 0.1~10 nm.

6) Thereafter, Al as a cathode is coated 200 nm thick thereon.

Second Embodiment

The second embodiment of the present invention is for fabricating the organic EL device shown in FIG. 3. A method of fabricating a device is carried out by the same manner of the first embodiment except the step of forming a buffer layer.

First of all, starburst type derivative is deposited about 2 nm thick by vacuum deposition. And, Li is deposited about 1 nm thick on the deposited starburst type derivative. Each thickness of the starburst type derivative and Li can be selected from 0.1~20 nm. And, the order of forming the starburst type derivative and Li layers can be reversed. Besides, a total thickness is 0.1~40 nm.

Third Embodiment

The third embodiment of the present invention is for fabricating an organic EL device having a concentration gradient in accordance with positions of two materials when starburst type derivative and Li are mixed with each other. And, a method of fabricating the device is carried out by the same manner of the first embodiment except the step of forming a buffer layer.

Namely, starburst type derivative:Li=x:y(x=1, y=0) at a contact interface between cathode and buffer layer, starburst type derivative:Li=x:y(x=0, y=1) at a contact interface between electron transport layer and buffer layer, and x and y values vary linearly between one contact interface of cathode and buffer layer and the other contact interface of organic layer and buffer layer.

A total thickness of the buffer layer is 0.1~100 nm.

Figure 4:
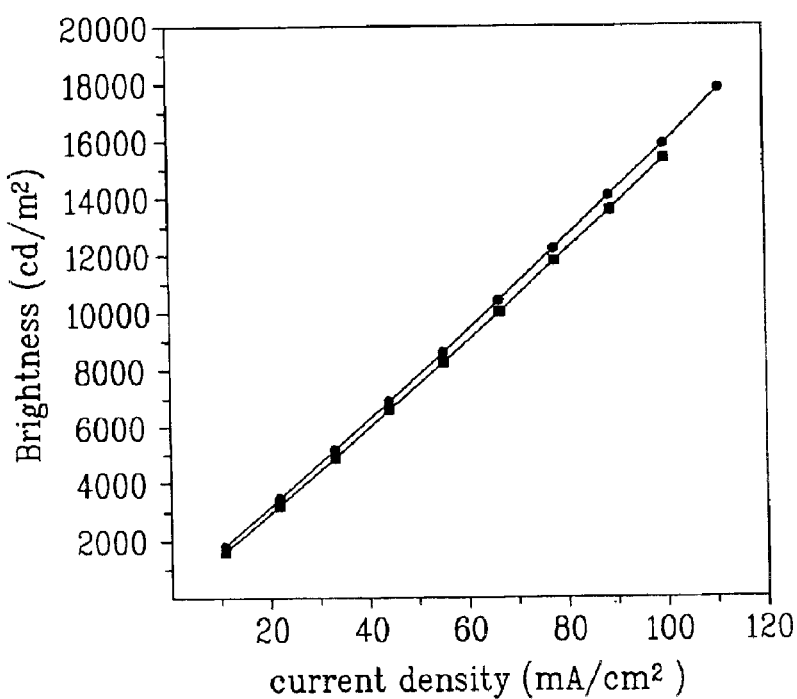
FIG. 4 illustrates a brightness graph comparing a device having a buffer layer according to the present invention to a device failing to have a buffer layer.

FIG. 4 illustrates a brightness graph comparing a device having a buffer layer according to the present invention to a device failing to have a buffer layer.

In a graph of FIG. 4, '- -' indicates an organic EL device including $CuPC/(Alq_3+dopant)/Alq_3/Li(10 Å)/Al$ and '- -' indicates another organic EL device including $CuPC/(Alq_3+dopant)/Alq_3/1:1$ starburst:Li buffer layer (100 Å)/Al. The device having the buffer layer, as shown in the graph, performs high brightness.

The present invention forms to insert the buffer layer including alkaline metal or alkaline earth metal compound and the starburst type derivative between the cathode and electron transport layer (or light-emitting layer), thereby improving efficiency and durability of the organic EL device. The starburst type derivative contributes to improve adhesion between the cathode and organic layer, and alkaline metal or alkaline earth metal compound lowers an electron injection barrier.

Moreover, the buffer layer of the present invention plays a role in inhibiting the penetration of water into the organic EL device and the use of the buffer layer increases an overall thickness of the organic layer so as to reduce a capacitance of the device. Therefore, the present invention enables to improve efficiency and durability of the organic EL device as well.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An organic electroluminescent display device comprising:

a transparent substrate;

an anode formed on the transparent substrate;

an organic layer stacked on the anode;

a cathode formed on the organic layer; and a buffer layer formed between the cathode and organic layer, the buffer layer including a first material selected from the group consisting of alkaline metals, alkaline earth metals, alkaline metal compounds and alkaline earth metal compounds and a second material wherein the second material is an aromatic amine having the following structural formula:

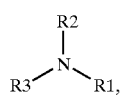

where each of R1, R2, and R3 is selected from the group consisting of hydrogen, alkyl group, substituted or unsubstituted aromatic ring, and substituted or unsubstituted aromatic amine wherein at least one of R1, R2, and R3 is substituted or unsubstituted aromatic ring or substituted or unsubstituted aromatic amine and further, wherein a composition ratio between the first and second materials x and y constituting the buffer layer is x:y=(1~100):1 or x:y=1:(1~100) and a total thickness of the buffer layer is 0.1~10 nm.

2. The device of claim 1, wherein the buffer layer is a mixture formed by co-depositing the first material and the aromatic amine.

3. The device of claim 1, wherein the buffer layer is formed by stacking first/second layers or second/first layers in order and wherein the first layer is formed of one of alkaline metal and alkaline earth metal.

4. The device of claim 3, wherein each of the first and second layers is 0.1~20 nm thick and, a total thickness of the buffer layer including the first and second layers is 0.1~40 nm.

5. The device of claim 1, wherein the buffer layer is formed to have a concentration gradient in accordance with positions of the first material and the aromatic amine.

6. The device of claim 5, wherein a composition ratio between the first and second materials x and y at an interface of the buffer layer contacted with the cathode is x:y=1:0 or x:y=0:1, wherein the composition ratio of the first and second materials x and y from the interface of the buffer layer contacted with the cathode to the other interface contacted with the organic layer has the concentration gradient, and wherein a total thickness of the buffer layer is 0.1~100 nm.

7. The device of claim 1, wherein the alkaline metal, alkaline earth metal, alkaline metal compound or alkaline earth metal compound is selected from the group consisting of Li, Na, K, Be, Mg, Ca, Sr, Ba, Y, La, Sm, Gd, Yb, Cs, $Li_2O$, $Li_2O_2$, $Rb_2O$, $Cs_2O$, $Rb_2O_2$, $Cs_2O_2$, $LiAlO_2$, $LiBO_2$, LiCl, RbCl, NaCl, $KAlO_2$, $NaWO_4$, $K_2SiO_3$, $Li_2CO$, BeO, MgO, CaO, SrO, BaO, RaO, Al:Li, Mg:Sr, and In:Li alloy.

8. The device of claim 1, wherein the aromatic amine is a compound having the following structural formula:

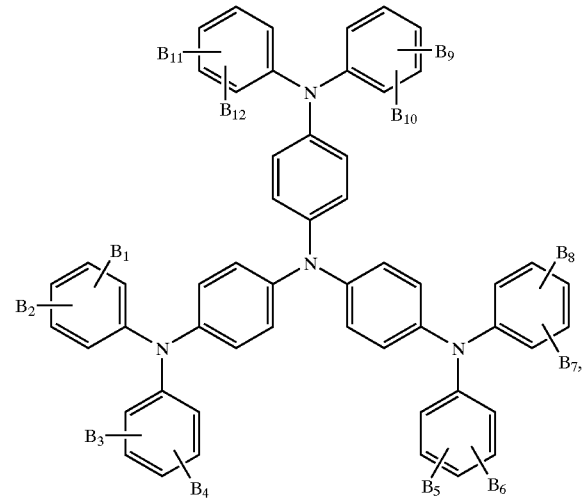

where each of $B_1$, $B_2$, $B_3$, $B_4$, $B_5$, $B_6$, $B_7$, $B_8$, $B_9$, $B_{10}$, $B_{11}$, and $B_{12}$ is selected from the group consisting of hydrogen, alkyl group, substituted or unsubstituted aromatic ring, and substituted or unsubstituted aromatic amine wherein the $B_1$, $B_2$, $B_3$, $B_4$, $B_5$, $B_6$, $B_7$, $B_8$, $B_9$, $B_{10}$, $B_{11}$, and $B_{12}$ are linked to each other so as to form a saturated or unsaturated fused cyclic ring.

9. The device of claim 8, wherein the aromatic amine is selected from the group consisting of:

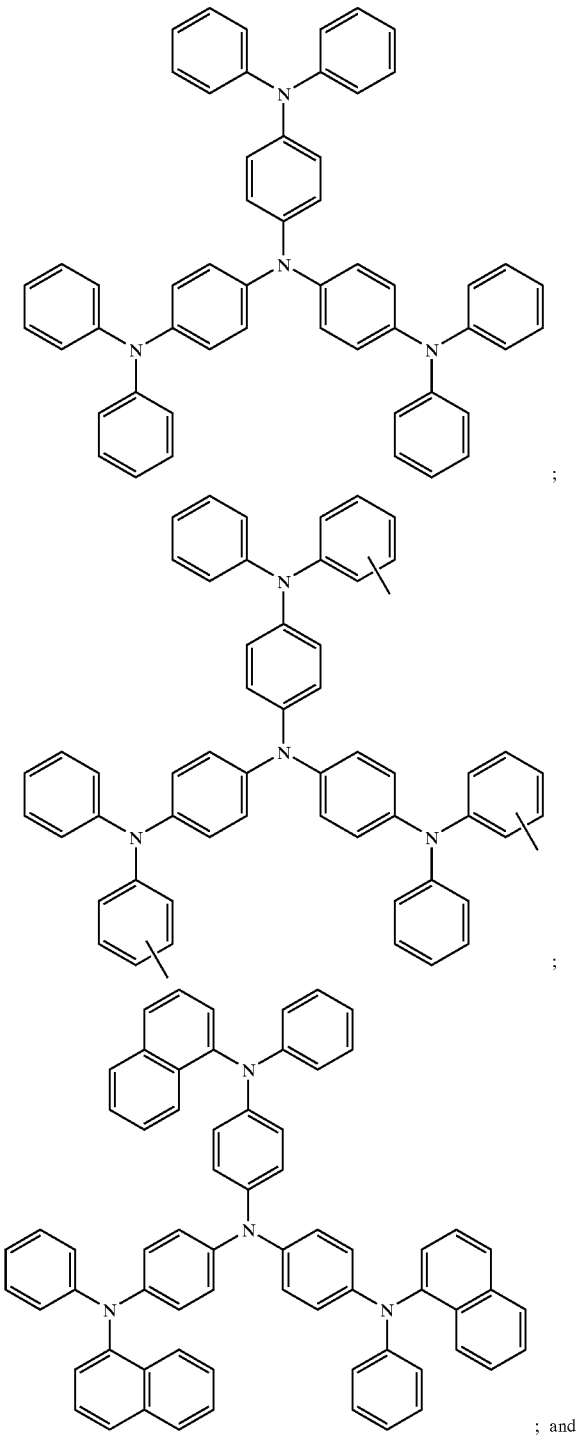

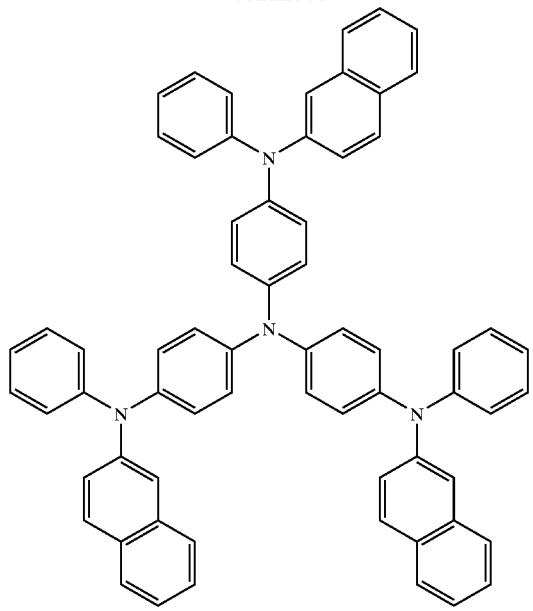

10. The device of claim 1, wherein the aromatic amine has the following structural formula:

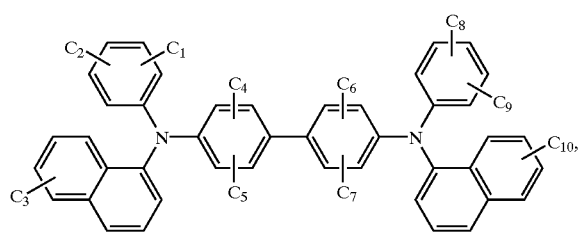

where each of $C_1$, $C_2$, $C_3$, $C_4$, $C_5$, $C_6$, $C_7$, $C_8$, $C_9$, and $C_{10}$ is selected from the group consisting of hydrogen, alkyl group, substituted or unsubstituted aromatic ring, and substituted or unsubstituted aromatic amine wherein the $C_1$, $C_2$, $C_3$, $C_4$, $C_5$, $C_6$, $C_7$, $C_8$, $C_9$, and $C_{10}$ may be linked to each other so as to form a saturated or unsaturated fused cyclic ring.

11. The device of claim 10, wherein the aromatic amine has the following structural formula:

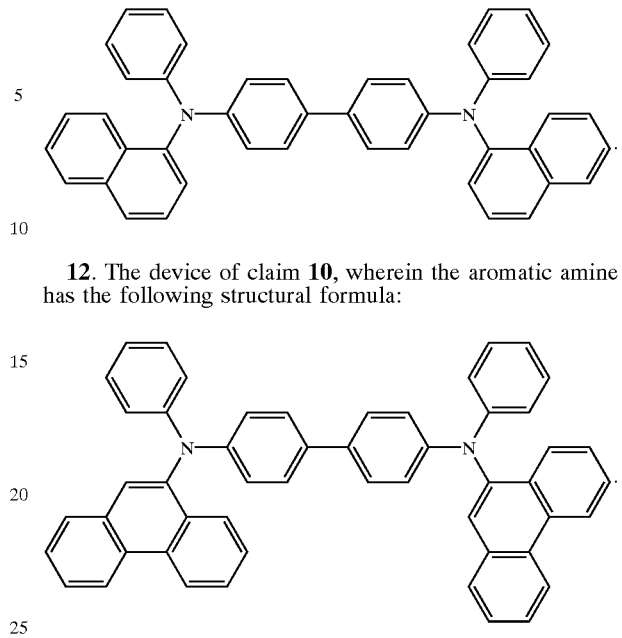

12. The device of claim 10, wherein the aromatic amine has the following structural formula:

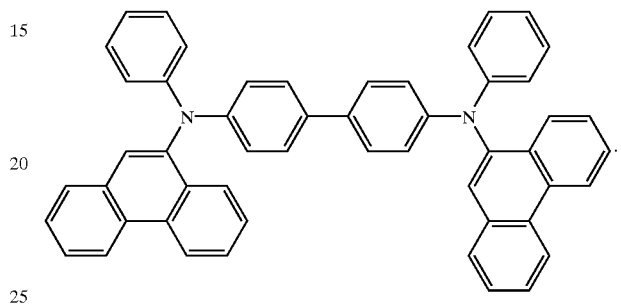

13. The device of claim 1, wherein the organic layer comprises a hole injection layer, a hole transport layer, an organic light-emitting layer, and an electron transport layer.

14. The device of claim 13, wherein the buffer layer is formed between the cathode and electron transport layer.

15. The device of claim 13, wherein the buffer layer is formed between the cathode and organic light-emitting layer.

16. An organic electroluminescent display device comprising:
a transparent substrate;
an anode formed on the transparent substrate;
an organic layer stacked on the anode;
a cathode formed on the organic layer; and a buffer layer formed between the cathode and organic layer, the buffer layer including a first material selected from the group consisting of alkaline metals, alkaline earth metals, alkaline metal compounds and an alkaline earth metal compounds and a second material selected from the group consisting of an organic compound and an organic metal compound, wherein a composition ratio between the first and second materials x and y constituting the buffer layer is x:y=(1~100):1 or x:y=1:(1~100) and a total thickness of the buffer layer is 0.1~10 nm.

* * * * *